(12) United States Patent
Toth

(10) Patent No.: US 7,632,355 B2
(45) Date of Patent: Dec. 15, 2009

(54) APPARATUS AND METHOD OF TREATING FINE POWDERS

(75) Inventor: Richard E. Toth, North Huntington, PA (US)

(73) Assignee: Allomet, N. Huntington, PA (US)

( * ) Notice: Subject to any disclaimer, the term of this patent is extended or adjusted under 35 U.S.C. 154(b) by 133 days.

(21) Appl. No.: 11/373,995

(22) Filed: Mar. 14, 2006

(65) Prior Publication Data

US 2006/0193978 A1 Aug. 31, 2006

Related U.S. Application Data

(60) Division of application No. 10/367,782, filed on Feb. 19, 2003, now abandoned, which is a continuation-in-part of application No. 10/079,504, filed on Feb. 22, 2002, now abandoned, which is a division of application No. 09/423,229, filed as application No. PCT/US98/09767 on May 13, 1998, now Pat. No. 6,372,346.

(60) Provisional application No. 60/046,885, filed on May 13, 1997.

(51) Int. Cl.
*C23C 16/06* (2006.01)
*C23C 16/442* (2006.01)

(52) U.S. Cl. .................................... 118/716

(58) Field of Classification Search ............ 118/19, 118/21, 24, 303, 716; 427/182, 212, 213, 427/419, 502
See application file for complete search history.

(56) References Cited

U.S. PATENT DOCUMENTS

| | | | |
|---|---|---|---|
| 3,752,655 A | 8/1973 | Ramqvist | |
| 3,871,840 A | 3/1975 | Wilder et al. | |
| 3,971,656 A | 7/1976 | Rudy | |
| 3,991,225 A * | 11/1976 | Blouin | 427/215 |
| 4,063,907 A | 12/1977 | Lee et al. | |
| 4,378,871 A * | 4/1983 | Clark | 193/2 R |
| 4,636,252 A | 1/1987 | Yoshimura et al. | |
| 4,640,218 A * | 2/1987 | Motoyama et al. | 118/19 |

(Continued)

FOREIGN PATENT DOCUMENTS

EP 0 012 631 A1 6/1980

(Continued)

OTHER PUBLICATIONS

Partial European Search Report from corresponding EP Application No. EP 08 00 7312.

(Continued)

*Primary Examiner*—Jeffrie R Lund
*Assistant Examiner*—Satish Chandra
(74) *Attorney, Agent, or Firm*—Finnegan, Henderson, Farabow, Garrett & Dunner, LLP

(57) ABSTRACT

The present invention relates to an apparatus and method for economic treatment of Geldhart class C or larger substrate powders of single or plural metal, ceramic, or polymeric materials. In particular, the present invention is directed to coating such powder via a fluidized CVD or PVD, electroless, electrochemical, or solution chemistry plating process, and provides processes and apparatus for accomplishing same. It is particularly suited to coating with single or plural layers of metal, ceramic, binder, sintering aid, or polymer onto such materials without agglomeration. The coated particles and products made therefrom exhibit novel physical properties that are not limited by classical chemical and thermodynamic constraints.

13 Claims, 1 Drawing Sheet

U.S. PATENT DOCUMENTS

| | | | |
|---|---|---|---|
| 4,778,521 A | | 10/1988 | Iyori et al. |
| 4,842,790 A | * | 6/1989 | Nunnelly .................... 264/117 |
| 4,940,523 A | | 7/1990 | Takeshima |
| 5,081,072 A | * | 1/1992 | Hosokawa et al. .......... 505/433 |
| 5,106,392 A | | 4/1992 | Slutz et al. |
| 5,172,813 A | * | 12/1992 | Ljokkoi ....................... 209/270 |
| 5,173,107 A | | 12/1992 | Dreyer et al. |
| 5,211,726 A | | 5/1993 | Slutz et al. |
| 5,470,388 A | * | 11/1995 | Goedicke et al. ............ 118/716 |
| 5,489,449 A | | 2/1996 | Umeya et al. |

FOREIGN PATENT DOCUMENTS

| | | |
|---|---|---|
| EP | 0 226 898 A2 | 7/1987 |
| EP | 0 417 333 A1 | 3/1991 |
| EP | 0 493 351 | 7/1992 |
| EP | 0 577 375 A1 | 1/1994 |
| GB | 2282824 * | 10/1993 |
| GB | 2282824 * | 4/1995 |
| GB | 2282824 A * | 4/1995 |
| JP | 07 053271 | 2/1995 |
| JP | 09 020952 | 1/1997 |

OTHER PUBLICATIONS

Hintermann et al.; "*New Generation Superabrasive Tool with Monolayer Configuration*", Science, vol. 1(2) pp. 1131-1143 (Dec. 3, 1992), XP000360481.

European Search Report from corresponding EP Application No. EP 08 00 7312, dated Mar. 10, 2009.

English language Derwent Abstract of EP 0 226 898, dated Jul. 1987.

English language Abstract from Patent Abstracts of Japan for JP 07 053271, dated Feb. 1995.

English language Abstract from Patent Abstracts of Japan for JP 09 020952, dated Jul. 1995.

\* cited by examiner

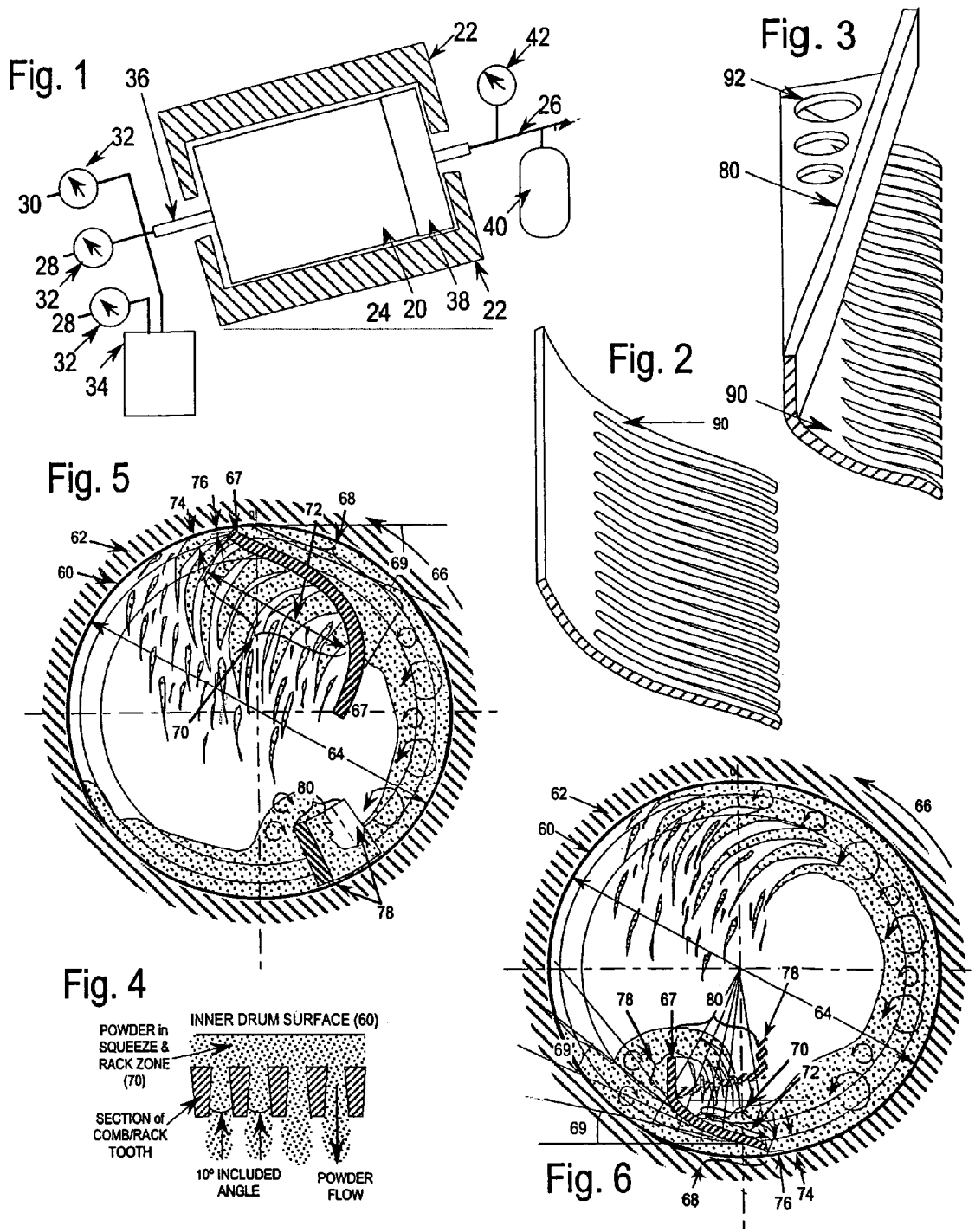

APPARATUS AND METHOD OF TREATING FINE POWDERS

CROSS REFERENCE TO RELATED APPLICATION

This is a division of application Ser. No. 10/367,782, filed Feb. 19, 2003 now abandoned, which is a continuation-in-part of U.S. application Ser. No. 10/079,504, filed on Feb. 22, 2002 now abandoned, which is a divisional application of U.S. application Ser. No. 09/423,229, filed on Feb. 29, 2000, now U.S. Pat. No. 6,372,346, which is a national stage filing of PCT/US98/09767, filed May 13, 1998, which claims priority under 35 U.S.C. § 119(e) to U.S. provisional application No. 60/046,885, filed May 13, 1997, all of which are incorporated herein by reference.

BACKGROUND OF THE INVENTION

1. Field of the Invention

The invention relates to the treatment, and particularly the encapsulation and deagglomeration of particles previously difficult to coat in a fluidized bed, for example, because of the size and/or density of the particles. Such particles generally comprise metal, binder, ceramic, refractory, or polymer with a coating or coatings of metal, binder, ceramic, sintering aid, or polymer.

2. Background of the Invention

Encapsulated powders have been produced for decades for a variety of purposes including fuel particles, pigments and paints, pharmaceuticals, magnetic components, fluorescent lamps, RF shielded plastic fillers, abrasive particles, metal matrix composites, and electronic applications.

Tough-Coated Hard Powders (TCHP) now promise to usher in a new family of materials exhibiting new paradigm combinations of properties including wear resistance, toughness, and light weight. In tool applications, it is expected that TCHP's will greatly surpass the performance of chemical vapor deposited (CVD)-coated carbide inserts. Since the powder contained within an insert has a surface area thousands of times greater than that of the insert itself, CVD-coating TCHP's (a surface-dependent process) is clearly more efficient. In addition, the thickness of coatings on micron-sized particles is several orders of magnitude thinner than the coatings on the outsides of inserts, reducing the time necessary to coat powder versus tool inserts. To achieve the full potential TCHP's will require the development of an industrial scale process for coating ceramic or metal powders, especially particles less than approximately 10 microns in size and lighter than about 10 g/cc, hereafter referred to as "Geldart Class C" particles.

Many different methods have been used to produce these coated powders, including spray drying, electroless plating, molten salt, plasma coating, chemical vapor deposition, physical vapor deposition, and others. One of the most successful and well-known methods has been CVD coating, particularly using fluidized bed technology.

Much is taught in the prior art about preparation of coatings on powders. As the need for smaller and smaller coated particles increases, the principle barrier to achieving uniform, contiguous coating has been the tendency for particles below 10 to 15 microns to severely agglomerate and clump. Ordinary horizontal fluidized beds and barrel coaters are simply unable to overcome the strong interparticulate attractors, such as van der Waals forces, that increase with decreasing particle diameters. Accordingly; a variety of apparatus has been developed in an attempt to overcome these deficiencies.

Few of the prior art methods and apparatus are capable of effectively coating contiguous and homogeneous coatings on Geldart Class C powders. One exception is platelet-shaped particles, where the small thickness-diameter particle aspect ratio is calculated as within Geldart Class C but the large 15-25 micron diameter allows it to fluidize as if it were a much larger average particle size.

One of the most widely-used methods of coating powders is the fluidized bed. Fluidized bed reactors are especially useful and economical to operate because of the high exposure of solid surfaces to the carrier and decomposing coating source reactant gases. This benefit, however, is considerably offset by the principal limitations of fluidized beds: agglomeration and bonding of the powders.

As is well-known, for example, when fluidized beds are used for the production or coating of very fine powders, particles in the bed are susceptible to (a) agglomeration by van der Waals and other interparticulate attractor forces and/or (b) sintering or cementing together of particles by the coating being deposited on their surfaces at high temperature. If these agglomerated or sintered particles are not continuously broken apart, their points of contact prevent complete coating and the lumps may tend to grow and settle to the bottom of the fluidizing bed, greatly reducing effective surface areas.

In a powder coating process, the key particle parameters are particle density, size, and temperature. It is well understood that particles of low density are much more easily entrained by fluidizing gases than are heavier particles. Further, from Geldart's classifications of particles (see Kunii and Levenspiel, *Fluidization Engineering*, 2nd ed., Butterworth-Heinemann, 1991, pp. 75-79), it is known that agglomeration or sintering increases in fluidizing Geldart Group C fine particles as the particle size decreases below about 40 microns. In "Types of Gas Fluidization," *Power Technology*, 1973, pp. 285-292, D. Geldart classifies the behavior of fluidized beds into groups depending on the density difference between the fluidizing gas and the solids and mean particle size. Group A powders exhibit dense phase expansion after minimum fluidization and prior to incipient bubbling operation. Group B powders bubble at the minimum fluidization velocity, and Group C (below approximately 10 microns and lighter particles below about 10 g/cc) are difficult to fluidize at all, and those in group D can form stable spouted beds. When fluidizing Geldart Group B or D particles (larger than about 100 microns), interparticle cohesive forces are negligible compared with the forces the fluidizing gases exert on the particles.

It is also known (e.g., in Ceramic Fabrication Processes, ed. W. D. Kingery, MIT Press, Cambridge, Mass., 1958, pp. 120-131) that the probability for particles to bridge and adhere to each other increases with increasing temperature and with increasing duration of the interparticulate contact. Because most coated powder applications require complete and homogeneous coating layers, the foregoing factors prevent the use of all but a small number of the methods and apparatus taught in the prior art.

One approach to deagglomerating fine powders during their coating is embodied in the Recirculating Fast Fluidized Bed Chemical Vapor Deposition Reactor (RFFB-CVDR), disclosed in U.S. Pat. No. 5,876,793 to Sherman, et al. In the RFFB-CVDR, the individual particles are fully coated by recirculating them continuously in a recirculating fluidized bed operated in fast-fluidizing or turbulent fluidization conditions, with no distinct boundary between the top of the bed and the vapor phase above the bed. Each time an individual particle passes through the reaction zone, it receives a few more angstroms of coating because the particles are deagglomerated in a turbulent gas stream that individualizes the particles by high-shear forces and interparticulate collisions that break up the agglomerates. This allows complete exposure of the particle surface to the coating vapors. To prevent agglomeration and to obtain uniform coatings, it is necessary to operate the system well-above the bubbling conditions characteristic of most fluidized beds. The velocity of the gas stream in the fluidized bed is high, approximately 0.1 to 1.0 m/s. At these gas velocities, the particles, unless relatively large or relatively heavy, are carried through the bed before achieving their desired thickness of coating. Recirculating the particles is then necessary. Because the velocity of the gas stream in the reaction zone is such that it quickly carries substantially all of the particle upwardly out of the bed, many passes through the reaction zone are generally necessary to adequately coat a particle. The particles, except for agglomerates, are generally not classified in the primary reaction zone because the bed is operated at too high a gas flow rate. As each particle makes one pass through the system, it accumulates only a small amount of coating thickness, requiring multiple passes through the reaction zone to build up the desired thickness.

Because of the high gas flow velocities, submicron light density (2-9 g/cc) particles and intermediate to heavy density (10-20 g/cc) particles and below about 5 to 10 microns are strongly entrained by the turbulent gas flow and must be recirculated as many times as is required to build up the desired coating thickness. These particles must be separated from the gas stream by one or more cyclones or by other gas-solid separation and filtration methods well-known in dust collection processes, and collected in a second bed which may or may not be fluidized, downstream of the reaction zone. When the first bed is operated in the fast-fluidization condition, the velocity of the gas stream is in excess of the terminal velocity of the particle in that stream and the particles are quickly carried into the reaction zone and into the collection zone. After collection, the particles must be transported from the collection zone in the second bed to the primary fluidized bed by mechanical, pneumatic, or other means. The second bed, if fluidized, is operated at gas velocities well below turbulent conditions.

Even such reactors, capable of fluidizing, deagglomerating, and coating uniform Geldart Group C particles, are challenged beyond their capabilities of coating contiguous and homogeneous coatings in many practical industrial situations.

For example, an important limitation of the RFFB-CVDR and other high gas-shear reactors is that the gas-stream deagglomeration principle fundamentally requires high gas stream velocities. Such velocities are required to entrain and elutriate a very high percentage of the distribution of the particles being coated to allow them to be captured and collected by various means in order to recirculate and recoat them. Elutriation is the process in which fine particles are carried out of a fluidized bed due to the fluid flow rate passing through the bed. Typically, fine particles are elutriated out of a bed when the superficial velocity through the bed exceeds the terminal velocity of the fines in the bed. However, elutriation can also occur at slower velocities.

Fine particles in fluidized beds come from feed streams; commercial core powder mechanical milling, attrition, or breakage of larger particles. Temperature or diffusion stress cracking and size reduction due to chemical reactions and shrinkage can also result in fine particles. When fines elutriation is a problem that cannot be reduced or eliminated with modifications to the bed design, fines can often be recovered such as with cyclones or hydrocyclones. Leva (*Chem. Engr. Prog.*, 47, 39, 1951) measured the rate of elutriation (total mass per time) from a bed of particles with a bimodal size distribution. He found that:

(1) When the column height above the bed is small, the elutriation rate is high. However, if the column height exceeds a certain minimum size then the rate is constant minimum value. This occurs because small particles that are expelled from the top of the bed have high velocities that require greater distance to slow down and turn around to return to the bed.

(2) The elutriation process causes a decrease in particle concentration. A fluidized bed behaves similar to a mixture of liquids with different volatilities. For example, in the liquid-liquid mixture, the more volatile material leaves the mixture at the lower boiling temperature. By analogy, the finer particles have a lower boiling temperature than the larger particles. The boiling temperature is analogous to the fluidization velocity. The higher the velocity, the greater the rate at which the low boilers will leave the bed. The free space height above the bed serves as a condenser, to cool and slow down the elutriated particles and return them to the mixture. The greater the boiling rate, the greater capacity that is needed of the condenser, hence the greater free space height.

In operating the fluidizing gases to levitate and recycle the mid to large size particles in the primary reaction zone to prevent them from settling, uncoated, in the bottom of the bed, the smaller particles are elutriated with the high volume and high speed gas flow stream and must be recycled.

The elutriation phenomenon leads to a major limitation of the RFFB-CVDR. Most commercially-available powders have a wide particle size distribution that is often bi- or tri-modal. In smaller Geldart Class C powders, such a distribution will often have a substantial percentage (15-25 percent of particles) of nanofines. Thus, heavy powder particles averaging below about 0.5 microns and light density particles averaging below about 5 to 10 microns contain major percentages of particles that are extremely difficult to separate from gas streams which overload the particulate collection systems and rapidly clog them. The particle size described throughout the specification is based on a number count distribution.

When it is a primary objective to coat smaller Geldart Class C powders, as in the case of Tough-Coated Hard Powders (TCHP), operating this equipment was traditionally difficult to impossible. It has been demonstrated using the RFFB-CVDR equipment on commercially-available 2-micron titanium nitride core powders, that nanofines quickly overload and clog the dust collection and filtration system. Avoiding this condition requires an expensive and quality-degrading (oxygen-inducing) Stokes Law sedimentation classification process to separate the fines and substantially reducing the yield of the incoming core powders.

Another major disadvantage is that the RFFB-CVDR, which operates in turbulent gas flow fluidization conditions, cannot be scaled down to smaller-diameter, smaller-capacity fluidized beds for research and development and for high-value products. The reason is that with smaller diameter RFFB-CVDR reactors, the fluidization gas flow becomes laminar, severely reducing both the interparticulate collisions and the high gas shear forces that break up agglomerates. The smallest RFFB-CVDR reactors have large fluidized bed diameters that require at least 10 to 15 kgs of light and small core particles, resulting in a lot weight of at least 50 to 60 kgs of material. Test increments of different coating weight percentages of the intermediate and binder coatings, plus test increments of extremely expensive core powder such as cubic boron nitride or diamond, or test increments involving different carbon percentages all become practically and economically out of reach because milling in test increments breaks off the coatings and blending has been found to be highly ineffective at these grain sizes.

Yet another major disadvantage of the RFFB-CVDR occurs when it is used to coat small and/or very light density Geldart Class C powders with 50-75 wt % of tungsten, for example. Here, the fluidization gas and thermodynamic parameters must be continuously altered as the particles gain size and weight. This requires sophisticated modeling, monitoring, instrumentation, and control systems to achieve industrial process and product repeatability.

Yet another major disadvantage of the RFFB-CVDR stems from the reduced residence times spent in the coating zone by the smaller particles and nanofines in a Geldart Class C particle size distribution. The RFFB-CVDR, by its inherent function, recycles high volume fractions of particles for long waits in the return system, while the heavier particles tend to reside full-time in the reaction zone, increasing coating thickness disproportionately. It has been found that this reduced uniformity of the coating thickness on both large and small particles in the distribution has a potentially severe effect. Longer residence times in the collection zones decreases the coating thickness of, for example WC on TiN core nanoparticles, while thinner WC coatings increase the probability that nitride and carbide core particles will be dissolved by and interact chemically with the other coatings such as cobalt or tungsten carbide during sintering into useful articles. Such interactions are characteristic of cermets and significantly reduce fracture toughness and wear resistance of the finished article. This process, involves significant heat losses, and thus reduces the thermal efficiency of the RFFB-CVDR reactor.

Still another major disadvantage of the RFFB-CVDR is that as the smaller particles are separated, collected, and recirculated into the reaction zone, they cool and must be reheated, wasting the heat energy gained in the reaction zone. Finally, this long residence time of the nanoparticles outside the hot reaction zone varies according to the amount of powder in the lot, creating two other major disadvantages. The larger the volume of powder in the return hopper, the less coating the smaller particles receive, creating a quality variation with lot size. The thinner the coatings of these nanofines, the higher the probability that these nano-coatings in TCHP will be breached during liquid phase sintering, allowing the cobalt to react with the core particles and weaken the WC substrate.

A well-known alternative approach to contiguously coating small and/or very light density Geldart Class C powders is to suspend the particles in a liquid medium. Here, the agglomerative attractor forces may be reduced by capillary and surface tension forces, and the shear forces that can be applied to the agglomerates that do form are orders of magnitude larger than with gaseous media. Examples of coating processes using liquid media are electroless, electrolytic, spray-dry, and non-aqueous solution-based chemical or electrolytic processes. The key barriers to wider use of these methods include removal of the liquid media after coating, residual salts or other products, oxidation, and coagulation of the coated powders.

If Geldart Group C core particles were commercially available in uniform, mono-modal, and/or narrow particle size distribution, this would considerably alleviate the limitations of the RFFB-CVDR and the use of liquid media. In fact, some different particle creation methods have resulted in commercial availability of a very few uniform, mono-modal, and/or narrow particle size distribution powders. This may become a trend with increasing numbers of core particle materials, but producing such uniform powders of many different ceramic materials is in itself a highly challenging scientific endeavor.

SUMMARY OF THE INVENTION

To avoid the above-described problems, there is provided an apparatus that includes a container for receiving particulate material. The container has a contacting surface. The apparatus further includes a rack comprised of elongated apertures between comb-like teeth. The teeth of the rack are set at an angle to the contacting surface to apply non-uniform compression to the particulate material as a result of relative motion between the rack and the contacting surface. The non-uniform compression is sufficient to force the particulate material to flow through the elongated apertures resulting in shear and tensile forces being applied to the particulate material. The apparatus further includes an inlet for introducing the particulate material into the container. While not wishing to be limited, it is believed that the non-uniform compression provides a flow gradient to the particulate material flowing through the elongated apertures. In one embodiment the apparatus further includes a reactant material inlet for introducing reactant materials into the container to coat them.

The present invention is also a method of treating particulate material, more particularly a method of mixing, blending, fluidizing, deagglomerating, and/or coating particulate matter. The method of treating particulate material comprises introducing the particulate material to a container having a contacting (or interior) surface and a contacting member within the container. The contacting member has a structural support portion and a comb-like portion with at least one elongated aperture therethrough. The structural support portion may be planar or non-planar. A non-uniform compression is applied to the particulate material by forcing the particulate material through at least one elongated aperture within the comb-like portion of the contacting member by the relative motion between the contacting member and the interior surface of the container. The non-uniform compression is sufficient to force the particulate material to flow through the elongated apertures resulting in shear and tensile forces being applied to the particulate material. The relative motion between the surface and the contacting member is adjusted such that the particulate material passes through a reaction zone within the container. Additional non-uniform compression is applied to the particulate material by forcing the particulate material between the planar portion of the contacting member by the relative motion between the contacting member and the interior surface of the container. The additional non-uniform compression is sufficient to apply shear and tensile forces to the particulate material, the amount of the additional non-uniform compression being determined by (i) the angle between the contacting surface and the contacting member, (ii) the coefficient of friction of the contacting surface and the contacting member, and (iii) the velocity of the relative motion between the contacting surface and the contacting member. The particulate material is retained within the container a sufficient time, and under sufficient conditions, which include chemical, pressure and thermal conditions, to treat the particulate material.

In one embodiment the angle between the surface and the contacting member provides compression, shear, or tensile forces to the particulate material in an amount sufficient to break-up agglomerates.

In another embodiment the method includes coating the particulate material. In still another embodiment the coating of the particulate material forms coated particles comprising: core particles comprising a first metal compound; and at least one layer on a majority of the core particles. The layer is comprised of a second metal compound, different in composition from the first metal compound and having a higher relative fracture toughness.

BRIEF DESCRIPTION OF THE DRAWINGS

The accompanying drawings are included to provide a further understanding of the invention and are incorporated in and constitute a part of this specification, and together with the description serve to explain the principles of the invention.

FIG. 1 is a schematic representation of a rotary CVD reactor used for forming the powders in accordance with one aspect of the present invention.

FIG. 2 is a representation of an embodiment of the deagglomerating rack shown within the device of FIG. 1 during deposition of the intermediate and outer particle layers by chemical vapor deposition.

FIG. 3 is a representation of an alternative embodiment shown within the device of FIG. 1 during deposition of the intermediate and outer particle layers by chemical vapor deposition.

FIG. 4 is a cross-sectional representation of the powder being forced between the teeth of the comb in section 70.

FIG. 5 is a cross-sectional representation of the interior of the device of FIG. 1, depicting the movement of particles within such a device during deposition of the intermediate layer by chemical vapor deposition. This figure is an end view of the deagglomeration rack component in a preferred embodiment of the device of FIGS. 1 and 2.

FIG. 6 is also a cross-sectional representation of the interior of the device of FIG. 1 showing a separate deagglomeration rack device and a Helical Guide device in their alternative embodiments.

DETAILED DESCRIPTION OF THE INVENTION

There are at least five challenges associated with practicing a CVD method in producing submicron TCHP particulate matter. Those five challenges are: (1) deagglomerating and uniformly coating Geldart Class C powders, (2) reducing the current cost of chemicals, (3) controlling the noxious characteristics of precursors, (4) reducing premature reaction of the precursors on surfaces other than on the core powder, and (5) carburizing the W coatings. While all have technical solutions, the ultimate success of the coating method will be determined by its cost relative to other coating methods and materials used.

The present invention solves these problems by providing a method and an apparatus for fluidizing, deagglomerating, homogenizing, and uniformly coating particulate matter. In a preferred embodiment, the particles are comprised of Geldart class C or larger powders of metal, binder, ceramic, or polymer with a coating or coatings of metal, binder, ceramic, sintering aid, or polymer.

Deagglomeration

As stated, one problem typically associated with treating Geldart class C or larger powders of metal, binder, ceramic, or polymer is the tendency of such powders to agglomerate, and thus not be uniformly treated. To expose the entire surface of each particle to the coating gases or chemicals, for example, the agglomerate "lumps" caused by van der Waals and other interparticulate attractor forces must first be continuously broken up.

In contrast to methods described in the prior art, e.g., subjecting the powder to strong crossbows of gas (yielding powder over entrainment) or using a high velocity "coffee-mill" blade to entrain and break up the agglomerates (damaging the coated particles), the present invention is directed to an apparatus and method using the apparatus to treat particulate matter. In one embodiment, the apparatus comprises at least three integral parts. First, the apparatus comprises a container for receiving particulate material, wherein the container has a contacting surface, which may comprise the inside or outside of a cylinder or drum, a disk, or a belt.

The apparatus next comprises at least one rack comprising elongated apertures between comb-like teeth. The teeth of the rack are set at an angle to the contacting surface of the container to apply non-uniform compression to the particulate material when the particulate material is entrained or squeezed as a result of relative motion between the rack and the contacting surface. Preferably, the angle is a negative rake angle ranging from about 10 to about 80 degrees.

The non-uniform compression is suitably applied to the particulate matter such that it forces the particulate material to flow through the elongated apertures resulting in shear and tensile forces being applied to the particulate material. The shear and tensile forces are in an amount sufficient to break up agglomerates of the particulate material. In certain circumstances, the non-uniform compression provides a flow gradient to the particulate material flowing through the elongated apertures.

In addition, the apparatus comprises an inlet for introducing particulate material to the container. When used in coating operations, the apparatus further comprise an inlet for introducing reactant materials into the container to coat the particulate material.

For illustration purposes only, it is assumed the rack will be stationary and mounted in a rotary drum reactor. The function of the stationary rack is to continually and assertively apply compression, shear, and tensile forces on any formed agglomerates of the treated powder, thus breaking-up the agglomerates. The comb slightly squeezes and compresses the agglomerated powder between the rotating drum and the stationary rack surfaces under shear and compressive load, then progressively allows the powder to flow and "extrude" through long apertures in an open, comb-like curved rack. A relatively sharp and slightly positive (acute) rake angle at the tooth edges provides a zero-flow boundary condition as shown in FIG. 4. The powder flow is highest at the midpoint of each opening (measured across the opening) and is restrained at the edges of each "tooth," placing the flowing powder in additional shear and tension, breaking and pulling apart the soft agglomerates.

The included squeeze angle between the two cylindrical surfaces of the drum and the rack should be approximately constant radially, generally ranging from about 10 to about 80 degrees, with one embodiment ranging from about 13 to about 70 degrees, and designed to meet the flow and compressibility characteristics of the range of powders to be handled. See FIGS. 5 and 6. When the rack is used against flat surfaces such as in rotating plates or belts, the rack may itself be flat instead of curved.

In certain embodiments, the width of the elongated apertures between the comb-like teeth are about the same size as the width of the teeth measured at the midpoint of the length of the teeth. The width of the apertures may increase along the length of the teeth from the edge of the rack opposite the teeth. To enable the powder to flow through the apertures, the length of the teeth ranges from about 4 to about 30 times the width, measured at the length midpoint. If required, the shear put on the powder and the load applied to the rack can be decreased by designing the openings to be wider than the teeth and by increasing the squeeze angle. The maximum tooth length depends on the maximum depth of the powder at the entrance to the squeeze zone (after deducting the amount of powder entrained upward and cascading downward) and the sine of the included squeeze angle.

The increasing volume of powder per revolution that must pass through an aperture increases with the radial distance from the axis of the drum, suggesting that the space between the teeth should increase along its length measured from the root to the tip of the teeth. Flow models will indicate whether the edges of the teeth should best be tapered to points or parallel to each other. In either case, the ends, and particularly the roots of the teeth, should be blended and rounded so as to relieve stresses on them at high temperatures. See FIGS. 2 and 3. For example, in one embodiment the apparatus comprises elongated apertures between the comb-like teeth that are larger than the width of the teeth. In this embodiment, the teeth are parallel to each other and the closed end of the apertures are rounded.

When used in a rotary drum reactor, the rack works in any radial position around the periphery of the drum. A preferred position is the top or near top part of the apparatus. In this position, just before the powder reaches the top dead center position of the apparatus, the powder discharges from the openings in the rack, thus cascading down from close to the top of the apparatus. See FIG. 5. This position slows the horizontal and centrifugal components of inertia of the powder imparted by the drum, disengages it from the drum, and causes it to fall into a "reaction zone" with greater certainty and in a more controlled manner. This allows greater focus of the incoming reactant gases into the deagglomerated powder stream. Thus, the powder flows, rolls, tumbles, cascades, and "aerates" by a combination of centrifugal force, gravity, and rotational inertia imparted by the drum. In the near-top position, the powder fall-distance is also at its greatest, maximizing the powder-reactant exposure per revolution.

This upper position of the rack described above also permits the reactor to operate at a higher and at a fixed rotational speed, since gravity is no longer required to disengage the powder lifted (and possibly "caked") by centrifugal force. This also simplifies the design of the combined helical rack. When used in the top or near top position, the rack itself need not be helical. Rather, a separate fixed helical guide (78, FIG. 5) is placed at or near the bottom position to guide the powder laterally and upwards to recirculate/recycle and mix it to prevent zones of powder with poor or incomplete coating. Higher rotational speeds (leading to a more vigorous entrainment of the powder) cause better fluidization of the powder and agglomerates, and will increase reactant-powder exposure to deposition gases, for example. The increased reactant-powder exposure rate increases deposition rate.

As shown, the powder "reaction zone" is better controlled by positioning the rack in the upper part of the apparatus. For example, the cascading powder is more easily incrementally or totally heated (preferably by microwaves) such that the powder is the hottest zone in the reactor. This prevents coating of the reactor walls and reduces coating of the rack, which permits higher temperatures that would not be supported by heating the reactor materials.

It is intended that the drum will rotate at a fixed speed at (a) a high enough velocity to assure centrifugal force will cause the core powder to adhere to the drum walls to lift it, and (b) an additional rotational velocity to add energy for vigorous entrainment, shear action, deagglomeration and coating efficiency. If the rotational speed is too high, the comb and its support may be overloaded and the powder may "cake" excessively on the walls of the drum due to excessive g-forces and squeezing by the comb.

The load on the rack should not be so great as to cause excessive elastic deformation or "chattering" of the comb-like assembly due to the variations in powder volume entering the squeeze zone.

An alternative location (See FIG. 6) for the rack and helical guide combined into a single part as shown in FIG. 3. The best annular positions for either the combined or the separate deagglomerator and guide, which may be located at any position, is determined by factors that include the size, shape, and density of the powders, speed of rotation of the drum, and the manner in which the powder to be collected falls and requires lateral homogenization.

Depending on the corrosiveness or aggressiveness of precursor reactants or chemicals used and the required operating temperatures, the materials selected for the reactor drum, the rack, and the helical guide may vary. In extreme conditions, as with $W(F)_6$ at temperatures above 1000° C., for example, the teeth of the rack are particularly subject to attack. In the range of 600-1100° C., austenitic steel, ferritic-austenitic steel, stainless alloy steels or superalloy steels, such as Hastelloy™ or Astroloy™ may be used. Depending on the conditions and particulate material used, the rack may be comprised of refractory metal, ceramic, quartz, carbon, or refractory-coated metallic alloys.

At higher temperatures, for example, alumina-based ceramic or carbon materials are employed. Alumina-coated superalloy steels, or ceramic materials may have to be used in constructing the rack and certain other reactor components. With ceramics, the moment of inertia of the cantilevered beam rack teeth must be increased.

Methods for Treating Particulate Material

The apparatus according to the present invention is advantageous in treating particulate material, such as deagglomerating or coating the particulate material. Exemplary coating processes that may be used in the present invention include chemical vapor deposition, physical vapor deposition, plasma deposition, and electrochemical deposition. Coating methods are typically chosen to provide a uniform coating thickness across a particle size distribution for the particulate material, wherein the particle size distribution ranges from about 1.0 nanometers to about 150 microns in average diameter. A preferred coating comprises one or more layers of metal, ceramic, binder, refractory alloy, sintering aid, or polymeric material.

A method according to the present invention includes introducing the particulate material, which may comprise one or more particles of metal, ceramic, referactory alloy, or polymeric material, to a container having a contacting surface (in some cases it is also referred to as an interior surface) and a contacting member within the container. As previously stated, the contacting member has a structural support portion and a comb-like portion with at least one elongated aperture therethrough. Depending on the shape of the container, for example, the structural support portion may be planar or non-planar. The contacting member is used to apply non-uniform compression to the particulate material by forcing it through at least one elongated aperture within the comb-like portion of the contacting member by the relative motion between the contacting member and the interior surface of said container, e.g., the contacting surface. The non-uniform compression should be in an amount sufficient to force the particulate material to flow through the elongated apertures resulting in shear and tensile forces being applied to the particulate material. By adjusting the relative motion between the surface and the contacting member, the particulate material passes through a reaction zone within the container. The particulate material is retained within the container a sufficient time, and under sufficient thermal, chemical, and pressure conditions, to treat the particulate material.

Additional non-uniform compression may be applied to the particulate material by forcing the particulate material between the structural support portion of the contacting member. The additional non-uniform compression, which results from the relative motion between the contacting member and the interior surface of the container, should be sufficient to apply shear and tensile forces to the particulate material. The amount of the additional non-uniform compression is determined by the angle between the surface and the contacting member.

In one embodiment, the method comprises coating particulate material to form coated particles comprising: (a) core particles comprising a first metal compound; and (b) at least one layer on a majority of the core particles, the layer comprising a second metal compound, different in composition from the first metal compound and having a higher relative fracture toughness.

The first metal compound comprises a stoichiometric compound of a nitride, a carbide, a boride, an oxide, a sulfide, or a silicide. In particular, the first metal compound comprises at least one of TiN, TiCN, TiC, ZrC, ZrN, VC, VN, cBN, $Al_2O_3$, $Si_3N_4$, $SiB_6$, SiAlCB, $W_2B_5$, AlN, $AlMgB_{14}$, $MoS_2$, $MoSi_2$, $Mo_2B_5$, $Mo_2B$, or diamond. The second metal compound comprises WC or $W_2C$.

In one embodiment, the method can be used to form coated particles comprising a plurality of core particles chosen from cubic boron nitride and diamond. The coated particles comprise an intermediate layer on a majority of the core particles, wherein the intermediate layer comprises WC, and has a thickness in the range of from 5% to 25% of the diameter of the core particles. The coated particles may further comprise an outer layer comprising cobalt or nickel overlaying the intermediate layer. In this embodiment, the combination of the core particles, the intermediate layer, and the outer layer form the coated particles.

In other embodiments, the method may be used to alter the coated particle composition. For example, the method may be modified to incorporate an intermediate layer comprising tool steel, glassy and devitrified nanosteel alloys, silicon nitride, or tantalum carbide.

More generally, the method may be used to form coated particles in which the core particles comprise a first metal compound having the formula $M_aX_b$, where M represents one or more metals selected from the group consisting of titanium, zirconium, hafnium, vanadium, niobium, tantalum, chromium, molybdenum, tungsten, aluminum, magnesium, copper, and silicon, X represents one or more elements selected from the group consisting of nitrogen, carbon, boron, sulfur, and oxygen, and a and b are numbers greater than zero up to and including fourteen.

A majority of these core particles may comprise a second metal or metal compound, different in composition from the first metal compound and having a higher relative fracture toughness than the first metal compound. The second metal or metal compound is one capable of bonding not only with the first metal compound, but with a metal selected from the group consisting of iron, cobalt, nickel, copper, titanium, aluminum, magnesium, lithium, beryllium, silver, gold, or platinum.

In each of the above-described methods, additional steps may be used depending on the desired treatment conditions and end-product. For example, a vapor phase stream comprising at least one of a reactive gas and an inert gas may be introduced to the container. Examples of such reactive and inert gases include nitrogen, hydrogen, argon, or oxygen, in which the reactive gas is advantageously chosen from hydrogen, oxygen, a carburizing gas, and a boronizing gas. The reactive gas and inlet gas may be introduced by use of ceramic or metallic frit.

The inventive method may further include the steps of filtering the vapor phase stream and recirculating the filtered vapor phase stream to the container. In certain embodiments, not only is the filtered vapor phase stream recirculated to the container, but the particulate material is also recirculated to the container. The particulate material may be recirculated by a feed screw, that has an inlet end and a discharge end. The feed screw may be designed with a progressively-increasing pitch from the inlet end to the discharge end.

In addition, both the vapor phase stream and the particulate material may be preheated prior to them being introduction into the container. A method according to the present invention may also include a step of neutralizing waste reactants by an exhaust trap system.

Efficient Use of Reactants

In addition to the foregoing, it has been found that by maintaining the temperature of the gas below the reaction threshold temperature until it is proximate to the core particles, the efficiency of the reactants significantly improve. This efficiency can be further improved by keeping the reactants separated until needed, mixing them by turbulent nozzles. It was found that microwave energy (but not induction frequencies) would directly couple with and heat the particles. At a frequency of 2.45 Ghz heating for about 2 minutes at 500 watts produced about 37-40° C. temperature rise. When fluidized, the rate of particle temperature rise is much higher. The concept of high heating rates in a focused, turbulent flow of reactants heated by the powder itself (heated by microwave energy) in a recirculating quartz tube has high appeal in achieving homogeneous deagglomeration, mixing, recirculation, and coating of submicron powders. Microwave energy may be introduced into the reactor via a waveguide and a quartz window (transparent to microwaves) at the side or at the periphery of the reactor. The major appeal is in maintaining the powder as the hottest zone in the reactor, rather than the walls of the reactor which are heated from external Joule or inductive sources. This assures that the powder, not the reactor walls, receive the coating. More importantly, the powder itself can be heated to much higher temperatures than the reactor can withstand, opening the way for direct deposition, for example, of stoichiometric WC instead of $W_2C$ or $WC_{(1-x)}$. This can be done using $W(F)_6$ at 1600-1800° C.

Homogenization of Coating

The prior art describes problems in the homogenization of powders coated with a CVD process. For example, premature CVD coating generally occurs at the reactant gas inlet. The flexibility of the apparatus associated with the present invention, particularly the use of a helical guide, overcomes this problem. As explained in more detail below, the use of a helical guide not only allowed the temperature at the reactant gas inlet to be lowered, but enabled tilting the axis of rotation of the reactor, both of which reduces if not eliminates premature CVD coating of powders.

The function of the helical guide (78, FIGS. 5 and 6) is to promote homogeneous coating of the powders in the coating device by physically transporting powders away from zones where the powders are statistically less likely to be coated to zones where the powder is more likely to be coated. In the case of a rotary cylindrical CVD furnace, the ends are cooler than the cylindrical surfaces. To obviate reduced coating thicknesses at the ends, the rotating axis of the reactor is tilted at an angle in the range from about 5 to about 15 degrees so that the powder lifted from the upper end falls laterally toward the hotter midsection of the cylinder. The helical guide "plows" the powder uphill from the lower side of the cylinder to the upper end, laterally recirculating and homogenizing the powders being coated.

The helical guide is a functional complement to the agglomeration rack, and may be made an integral part of the rack as shown in the figures. Alternatively, the helical guide can be separate when the rack is in the upper region of the drum reactor. While the cylinder is rotating, a well-designed helical guide located in the bottom position will evenly distribute the powder laterally along the length of the cylinder, serving both to eliminate the end-effect coating "dead zones" and to allow more efficient and even heating of the powder.

Reactor Sizing

The relationship $V=\pi r^2 l$ indicates that increasing diameter of the reactor is the most efficient way of increasing reactor volume. This also has the effect of reducing the potential for clogging at the gas exhaust port, and helps keep the entering reactant gases cooler, reducing the problem of premature deposition of coating at the entrance.

Increasing the drum diameter also creates more centrifugal and vertical lift to the powder per revolution, which increases homogeneity and fluidization efficiency. However, too short a length decreases the amount of heat that can be supplied to the surface of the drum at the periphery. On the other hand, too long a drum length decreases homogeneity and fluidization efficiency. The diameter of the reactor should be about twice its length.

Other Coating Processes

The deagglomeration rack also has direct application in electrolytic, electroless, and nonaqueous solution chemistry coating reactors and barrel platers. The principles apply to horizontal rotating disk beds as well as to continuous belt bed or translational rack operations. In these applications, the helical or angular guide device may or may not be required. It is possible to set the teeth of the rack at a single or compound angle so as to laterally guide the powder being coated.

Particle Removal

To remove particles that are entrained in the exhaust gases, disentrainment sections may be added, and appropriate ceramic or metallic filters added. The ceramic or metallic filter cannot be placed inside the rotating drum reactor because the powder cascading from above would quickly clog, e.g., within minutes.

The inventive apparatus and method are more particularly described with respect to the figures, as follows. The CVD reactor system of FIG. 1 comprises a rotating CVD reactor vessel (20), contained within a furnace (22) for heating the powder and reactant gases, which gases are delivered to the reactor and evacuated via gas inlet and outlet conduits (36, 26), respectively, at its opposite ends. Line (30) supplies the tungsten hexaflouride ($WF_6$), tungsten hexacarbonyl ($W[CO]_6$), tungsten acetyl acetenate, dicobalt octacarbonyl ($Co_2[CO]_8$), $Co(CO)_3NO$, $C_5H_5CO(CO)_2$ or $Co(Cp)(allyl)$ or other precursors, while lines (28) supplying the 99.999 percent purity hydrogen or other appropriate reactant gas, these being the two gases which react in the reactor vessel (20) to form the CVD coating, connect to the rotating seal and inlet conduit (36) through flow meters (32). Line (28) also passes through a gas bubbler (34), containing 99.9 percent purity isopropyl benzene in the case of $WF_6$ precursor. A filter (38) is interposed at the outlet side of the reactor (20), ahead of the evacuation conduit (26), which conduit is operatively connected to a vacuum system (not shown) and a trap device (40) and flow gauge (42). The reactor (20) may take the form of a stainless steel, hastelloy, refractory metal, quartz, or graphite drum which is capable of rotation at a variable speed, in the range 50 to 150 rpm depending on the drum diameter and specific gravity of the powder being coated, and of variation of its orientation. Thus, the angle of tilt (24) and the speed of revolution can be adjusted to provide the proper residence time for the coated powder within the high temperature (500-2300° C.) reactive gaseous environment produced.

FIG. 2 illustrates a configuration of the rack device found to solve the problem of agglomeration of the powder. The fluidization in an ordinary rotating reactor does not apply the shear forces required to break up Geldart Class C powder lumps, which continually reform. In fact, left unchecked, the agglomerates tend to classify themselves according to size, further hindering homogeneous processing. Additionally, a conventional horizontal reactor has end zones that reduce the homogeneity of the coating thickness in the batch. As depicted in FIGS. 5 and 6, a solution of the problem of agglomeration and end zones that produced nonuniform coating involved tilting the reactor and installing a fixed comb-like guide (80) to (a) recirculate and homogenize the batch, and (b) to apply sufficient shear to the powder to deagglomerate it.

Inside the furnace, the reaction chamber (62) is constructed of graphite, lined (60) with a quartz cylinder. The rotation speed (66) must be such that gravity force acting on the core powder is just greater than the centrifugal force, so that the falling powder grains, thus fluidized to maximize exposure to the reactant gases, accumulate the intermediate coating thereon. The objective is to flow, roll, cascade, and tumble the core powder by the right combination of centrifugal force, gravity, and rotational inertia from the rotation of the cylinder to maximize the exposure of the powder to the precursor gases. This implies a practical diameter (64) of larger than 120 mm. To assist in breaking up the agglomerate lumps that prevent deposition of homogeneous layers on each particle, reagent gases may be directed at the cascading powder stream at an appropriate flow rate to help break the agglomerates with additional shear force.

Shear is doubly applied to the powder in two zones of the guide (80), shown in cross section (67) at the lower end of the drum. The first zone (68) applies light pressure and horizontal plane shear to the powder as it is entrained and squeezed beneath the fixed guide by the rotating drum (60, 62). A progressive squeeze angle (69) of generally between about 13 and about 70 degrees is formed between the drum and the rack (67), which angle applies sufficient compressive shear to break the agglomerates. The second zone (70), consists of long (72), angular teeth forming the rack or comb itself, cut sharply, with little or no blending at the edges, into the stainless or steel or hastelloy. The design of the pins or fingers is also important. A flat surface against the powder will increase the "hydrodynamic" squeeze on the powder, while a small clearance angle (approximately 5 degrees) at the point of emergence of the powder and release of the flowing powder through and in between the "finger" of the rack will help put the powder in tension and shear as it is squeezed through the fingers, helping to continuously break up and reform the agglomerates in the restrained flow of powder. This zone (70) allows the compressing powder to flow between and escape under light vertical plane shear and tensile forces that serve to further deagglomerate and homogenize the particles for exposure during the next rotation as illustrated in FIG. 4. At a distance (74) of about 5 mm from the quartz or hastelloy liner (60), the progressive angle of the rack teeth is terminated with a point of inflection and a slight barb that increases the squeeze and lifts caked powder from the surface just as the openings of the teeth (72) reach their maximum width. A small clearance (76) of 0.5-1.0 mm protects the quartz or hastelloy lining from being scored by the rack and contributing impurities to the batch.

The helical zone (80) of the rack provides a guide (78), shown at the lower end of the reactor, (and shown at its upper end in dotted lines). This helical guide provides lift to the powder to assure lateral recirculation and batch homogeneity.

FIGS. 2 and 3 depict the helical rack in the preferred (FIG. 5) and one alternative embodiment (FIG. 6), respectively. The helical guide (80) is shown more clearly in FIG. 3. Holes (92) are cut into the upper platform to allow powder collected there to fall through for re-circulation. The teeth of the rack (90) are also shown more clearly. As previously indicated, in one embodiment the preferred location for the deagglomerating rack is at or near the uppermost radial position in the reactor as shown in FIG. 5, such that the rotation of the barrel or drum is constant. In this embodiment, the helical guide is just after bottom dead center to maximize lateral re-circulation and homogenization.

EXAMPLE

The apparatus hereinabove described was employed to effect CVD coating of $W_2C$ on TiN powder to create TCHP. The reactor was tilted on its rotational axis at 15 degrees and the combined rack and guide was operated with a 20° helix angle and with the comb fixed at a squeeze angle of generally between about 13 and about 60 degrees. The final angle used was approximately 60 degrees. A suitable amount of TiN core powder was introduced into the chamber of the graphite reactor. The system was purged, hydrogen flow initiated, and the internal pressure adjusted to 11.25 Torr. Power was then supplied to the electric furnace to bring the drum of the reactor, rotating at 90 revolutions per minute, to a temperature of about 550° C., for about one hour. The flow meters for the $WF_6$ supply and the cumene bubbler were then opened to provide a molar ratio of the reactants suitable for the deposit of $W_2C$ on the TiN substrate powder. The bubbler operated at 20° C., and hydrogen gas was used as the carrier for the liquid cumene. Operation was continued for a period of time sufficient to produce the desired thickness of $W_2C$ on the TiN particles, after which the $WF_6$ flow meter and the cumene bubbler were closed and the furnace was cooled under hydrogen.

The present invention has been disclosed in terms of examples and particular embodiments. The scope of the invention is not limited thereto but is defined by the appended claims and their equivalents.

What is claimed is:

1. A coating apparatus comprising:
   (a) a container for receiving particulate material, said container having a contacting surface;
   (b) at least one rack comprising elongated apertures between comb-like teeth, wherein said elongated apertures:
   are sufficiently wide to allow the passage of said particulate material;
   are parallel to each other and;
   have a length that is about 4 to about 30 times their width, said width measured at the midpoint of the length of the teeth
   wherein said teeth are:
   curved and located along one edge of said rack, and
   set at an angle to said contacting surface to apply compression to said particulate material when said particulate material is entrained or squeezed as a result of relative motion between said rack and said contacting surface, wherein said angle is a negative rake angle ranging from about 10 to about 80 degrees, and wherein said compression is sufficient to force the particulate material to flow through said elongated apertures resulting in shear and tensile forces being applied to said particulate material; and
   (c) an inlet for introducing particulate material to said container,
   wherein said container is in the form of a cylinder or drum, and said rack is at least proximate to the to or to the bottom of said cylinder or drum.

2. The apparatus of claim 1, wherein said compression provides a flow gradient to said particulate material flowing through said elongated apertures.

3. The apparatus of claim 1, further comprising a reactant material inlet for introducing reactant materials into said container to coat said particulate material.

4. The apparatus of claim 3, wherein the particulate material comprises core particles comprising a first metal compound; and said reactant material inlet is sufficient for introducing a second metal compound, different in composition from said first metal compound and having a higher relative fracture toughness.

5. The apparatus of claim 4, wherein said first metal compound comprises an essentially stoichiometric compound of a nitride, a carbide, a boride, an oxide, a sulfide, or a silicide.

6. The apparatus claim 4, wherein said first metal compound comprises at least one of TiN, TiCN, TiC, ZrC, ZrN, VO, VN, cBN, $Al_2O_3$, $Si_3N_4$, $SiB_6$, SiAlCB, $W_2B_5$, AlN, $AlMgB_{14}$, $MoS_2$, $MoSi_2$, $Mo_2B_5$, $Mo_2B$, or diamond.

7. The apparatus of claim 4, wherein said second metal compound comprises WC or $W_2C$.

8. The apparatus of claim 1, wherein said shear and tensile forces are in an amount sufficient to break up agglomerates of said particulate material.

9. The apparatus of claim 1, wherein said contacting surface comprises the inside or outside of said cylinder or drum.

10. The apparatus of claim 9, wherein said contacting surface of said cylinder or drum has a diameter approximately 0.25 to 25 times its width.

11. The apparatus of claim 1, further comprising a guide for said particulate material that causes said particulate material to recirculate or move laterally within said container.

12. The apparatus of claim 9, wherein said guide is at least proximate to the bottom of said cylinder or drum.

13. The apparatus of claim 1, said rack being comprised at least one of: stainless steel, austenitic steel, ferritic-austenitic steels, superalloy steel, refractory metal, ceramic, quartz, carbon, or refractory-coated metallic alloys.

* * * * *

UNITED STATES PATENT AND TRADEMARK OFFICE
CERTIFICATE OF CORRECTION

PATENT NO. : 7,632,355 B2 Page 1 of 1
APPLICATION NO. : 11/373995
DATED : December 15, 2009
INVENTOR(S) : Richard E. Toth It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 266 days.

Signed and Sealed this

Twenty-first Day of December, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,632,355 B2 |
| APPLICATION NO. | : 11/373995 |
| DATED | : December 15, 2009 |
| INVENTOR(S) | : Richard E. Toth |

It is certified that error appears in the above-identified patent and that said Letters Patent is hereby corrected as shown below:

In claim 1, column 16, line 20, "the to or" should read --the top or--.

In claim 6, column 16, line 37, "apparatus claim" should read --apparatus of claim--.

In claim 6, column 16, line 39, "VO," should read --VC,--.

In claim 12, column 16, line 54, "claim 9," should read --claim 11,--.

Signed and Sealed this
Twelfth Day of April, 2011

David J. Kappos
*Director of the United States Patent and Trademark Office*